United States Patent
Han et al.

(10) Patent No.: US 8,984,038 B2
(45) Date of Patent: *Mar. 17, 2015

(54) METHOD AND SYSTEM FOR UNCONSTRAINED FREQUENCY DOMAIN ADAPTIVE FILTERING

(71) Applicant: Broadcom Corporation, Irvine, CA (US)

(72) Inventors: Kuoruey (Ray) Han, Irvine, CA (US); Peiqing Wang, Laguna Beach, CA (US); Linghsiao Wang, Irvine, CA (US); Kishore Kota, Aliso Viejo, CA (US); Arash Farhoodfar, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/087,223

(22) Filed: Nov. 22, 2013

(65) Prior Publication Data
US 2014/0079101 A1    Mar. 20, 2014

Related U.S. Application Data

(63) Continuation of application No. 12/489,735, filed on Jun. 23, 2009, now Pat. No. 8,595,278.

(60) Provisional application No. 61/156,924, filed on Mar. 3, 2009.

(51) Int. Cl.
*G06F 17/10* (2006.01)
*G06F 17/14* (2006.01)
(Continued)

(52) U.S. Cl.
CPC ........... *H04B 1/123* (2013.01); *H03H 21/0027* (2013.01)
USPC ........... 708/322; 708/319; 708/323; 708/400; 708/403; 375/224; 375/226; 375/227; 375/232

(58) Field of Classification Search
CPC .................. H04N 19/00024; H04N 19/00296; H04N 19/008; H04N 19/00818; H04N 1/32154; H04N 19/00078; G06F 17/147; G06F 17/14; G06F 17/141; G06F 2205/00; H04L 25/03159; H04B 1/692; H04B 3/23; G01B 9/02007; G01B 9/02083; H03H 21/00
USPC .......... 708/319, 322–323, 400, 403; 375/224, 375/232, 346; 332/170
See application file for complete search history.

(56) References Cited

U.S. PATENT DOCUMENTS 4,494,214 A * 1/1985 Bernard et al. ............... 708/322
4,754,419 A * 6/1988 Iwata ............................ 708/322

(Continued)

OTHER PUBLICATIONS

European Search Report dated Jun. 26, 2013.
(Continued)

*Primary Examiner* — Farley Abad
*Assistant Examiner* — Henry Yu
(74) *Attorney, Agent, or Firm* — Oblon, McClelland, Maier & Neustadt, L.L.P.

(57) ABSTRACT

Aspects of a method and system for unconstrained frequency domain adaptive filtering include one or more circuits that are operable to select one or more time domain coefficients in a current filter partition. A value may be computed for each of the selected one or more time domain coefficients based on a corresponding plurality of frequency domain coefficients. The corresponding plurality of frequency domain coefficients may be adjusted based on the computed values. A subsequent plurality of frequency domain coefficients in a subsequent filter partition may be adjusted based on the computed values. Input signals may be processed in the current filter partition based on the adjusted corresponding plurality of frequency domain coefficients. A time-adjusted version of the input signals may be processed in a subsequent filter partition based on the adjusted subsequent plurality of frequency domain coefficients.

20 Claims, 6 Drawing Sheets

(51) Int. Cl.
*H04B 3/46* (2006.01)
*H03H 7/30* (2006.01)
*H04B 1/12* (2006.01)
*H03H 21/00* (2006.01)

(56) References Cited

U.S. PATENT DOCUMENTS

| | | | | |
|---|---|---|---|---|
| 4,933,891 | A * | 6/1990 | Schenk | 708/319 |
| 5,111,727 | A * | 5/1992 | Rossum | 84/603 |
| 5,526,426 | A * | 6/1996 | McLaughlin | 379/406.13 |
| 5,801,595 | A * | 9/1998 | Davis et al. | 332/170 |
| 6,269,132 | B1 * | 7/2001 | Yonge, III | 375/346 |
| 6,577,192 | B2 * | 6/2003 | Maniwa et al. | 330/149 |
| 6,785,700 | B2 * | 8/2004 | Masud et al. | 708/400 |
| 6,970,896 | B2 | 11/2005 | Awad et al. | |
| 7,103,623 | B2 | 9/2006 | Egelmeers et al. | |
| 7,171,436 | B2 * | 1/2007 | Egelmeers et al. | 708/322 |
| 7,502,816 | B2 | 3/2009 | Kumamoto et al. | |
| 7,693,291 | B2 | 4/2010 | Benesty et al. | |
| 7,714,937 | B2 * | 5/2010 | Kim et al. | 348/607 |
| 7,792,184 | B2 * | 9/2010 | Smee et al. | 375/232 |
| 7,933,323 | B2 | 4/2011 | Wang et al. | |
| 8,331,481 | B2 | 12/2012 | Lee et al. | |
| 2002/0073128 | A1 * | 6/2002 | Egelmeers et al. | 708/322 |
| 2003/0074381 | A1 * | 4/2003 | Awad et al. | 708/322 |
| 2006/0031276 | A1 * | 2/2006 | Kumamoto et al. | 708/403 |
| 2008/0080606 | A1 * | 4/2008 | Wang et al. | 375/232 |
| 2008/0118075 | A1 * | 5/2008 | Benesty et al. | 381/66 |
| 2009/0185607 | A1 * | 7/2009 | Lee et al. | 375/224 |

OTHER PUBLICATIONS

Derkx et al., "New Constraining Method for Partitioned Block Frequency-Domain Adaptive Filters", IEEE Transactions on Signal Processing, IEEE Service Center, New York, vol. 50, No. 9, pp. 2177-2186.

Paez Borrallo Josem et al., "On the implementation of a partitioned block frequency domain adaptive filter (PBFDAF) for long acoustic echo cancellation", Signal Processing, Elsevier Science Publishers B.B. Amsterdam, NL, vol. 27, No. 3, Jun. 1, 1992, pp. 301-315.

Nitsch B H, "The Partitioned Exact Frequency Domain Block NLMS Algorithm, A Mathematical Exact Version of the NLMS Algorithm Working in the Frequency Domain" AEU International Journal of Electronics and Communications, col. 52, No. 5, Jan. 1, 1998, pp. 293-301.

* cited by examiner

METHOD AND SYSTEM FOR UNCONSTRAINED FREQUENCY DOMAIN ADAPTIVE FILTERING

CROSS-REFERENCE TO RELATED APPLICATIONS/INCORPORATION BY REFERENCE

This application is a continuation of U.S. patent application Ser. No. 12/489,735 filed on Jun. 23, 2009, which makes reference to, claims priority to, and claims the benefit of U.S. Provisional Application Ser. No. 61/156,924 filed Mar. 3, 2009, all of which are hereby incorporated herein by reference in their entirety.

FIELD OF THE INVENTION

Certain embodiments of the invention relate to digital signal processing. More specifically, certain embodiments of the invention relate to a method and system for unconstrained frequency domain adaptive filtering.

BACKGROUND OF THE INVENTION

Adaptive filters adjust filter coefficients based on an error signal. The error signal ($\epsilon$) is determined based on an output signal (y) from the adaptive filter and a reference (or desired response) signal (d). The output signal is generated based on the error signal and an input signal. The input signal may be represented as a frequency domain vector, X. The error signal may be represented as a vector, wherein each vector entry is a sample value taken at a distinct time instant. The length of the vector error signal may be extended by the addition of a plurality of entries, each of which has a value of 0. The zero-filled error signal vector, which may be represented in the time domain, is converted to a frequency domain error signal (E) by utilizing a fast Fourier transform (FFT). A complex conjugate transpose ($X^H$) of the input signal X is also generated. The complex conjugate transpose $X^H$ and frequency domain error signal E may be convolved to generate a convolution result, for example, by performing a circular convolution operation.

The convolution result may be subjected to a gradient constraint operation. For example, the convolution result may be converted to a time domain representation by utilizing an inverse fast Fourier transform (IFFT). The time domain convolution result, which may be represented as a vector, may be zero filled as described above. The zero-filled time domain convolution result may be converted to a frequency domain representation by utilizing a FFT to generate a constrained convolution result.

The constrained convolution result may be multiplied by a step size parameter ($\mu$) to generate an adjustment vector. The adjustment vector may comprise a plurality of adjustment values. The adjustment vector may be added to a current filter coefficient vector (H(n)), where n represents a time instant index. After a time delay of one time unit, the adjusted coefficient vector becomes the new current filter coefficient vector (H(n+1)).

A new frequency domain representation of the output signal, Y, may be generated by performing a convolution operation on X and H(n+1). The frequency domain Y may be converted to generate a new time domain output signal y. The new output signal y may be utilized to generate a new error signal ($\epsilon$) as described above.

In instances in which the input signal X corresponds to time domain signal (x) that has a long time duration impulse response, a partitioned adaptive filter approach may be utilized.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for unconstrained frequency domain adaptive filtering, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for unconstrained frequency domain adaptive filtering. In various embodiments of the invention, one or more time domain coefficients in a current filter partition may be selected and frequency domain version of the input signals may be generated. A value for each of the selected one or more time domain coefficients may be computed based on a corresponding plurality of frequency domain coefficients. The corresponding plurality of frequency domain coefficients may be adjusted based on the computed values. A subsequent plurality of frequency domain coefficients in a subsequent filter partition may be adjusted based on the computed values. The input signals may be processed in the current filter partition based on the adjusted corresponding plurality of frequency domain coefficients. A time-adjusted version of the input signals may be processed in a subsequent filter partition based on the adjusted subsequent plurality of frequency domain coefficients. An output signal from the current filter partition may be generated by convolving the adjusted corresponding plurality of frequency domain coefficients and the frequency domain version of the input signals.

The one or more time domain coefficients may be selected based on a number of points in a fast Fourier transform algorithm. The selected one or more time domain coefficients may be computed by adding a value for a first of the corresponding plurality of frequency domain coefficients, a last of the corresponding plurality of frequency domain coefficients, and each of even-numbered ones of the corresponding plurality of frequency domain coefficients. The selected one or more time domain coefficients may be computed by subtracting a value for each of odd-numbered ones of the corresponding plurality of frequency domain coefficients. A frequency domain correction vector may be computed by multiplying the computed selected one or more time domain coefficients and a vector, wherein odd-numbered coefficients in the vector are equal to 1 and even-numbered coefficients are equal to –1. The adjusted the corresponding plurality of frequency domain coefficients may be computed based on the frequency domain correction vector. A frequency domain correction vector may be computed by multiplying the computed the selected one or more time domain coefficients and a vector, wherein each coefficient in the vector is equal to 1. The adjusted subsequent plurality of frequency domain coefficients may be computed based on the frequency domain correction vector.

Figure 1:
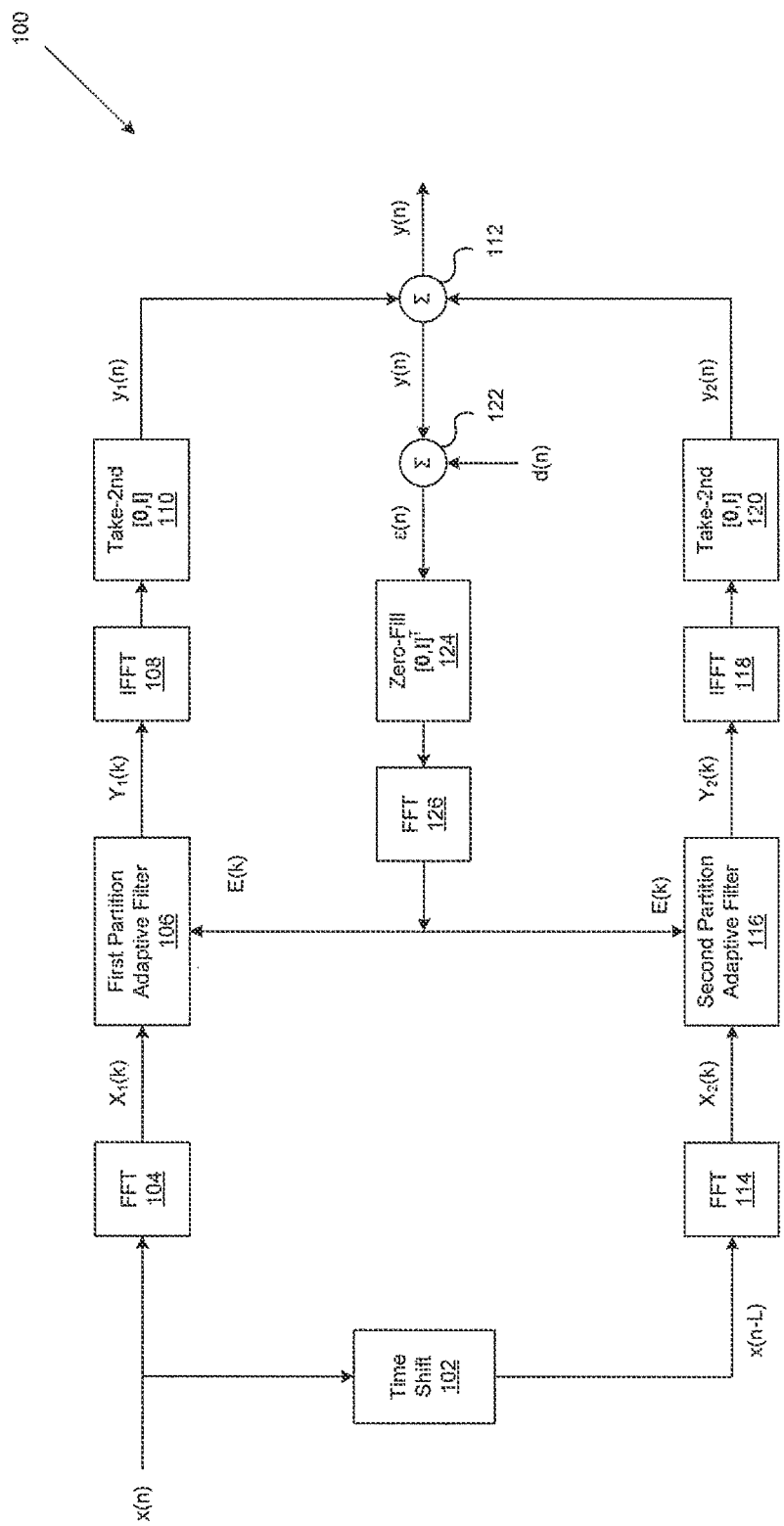
FIG. 1 is block diagram of an exemplary partitioned equalizer system, in accordance with an embodiment of the invention.

FIG. 1 is block diagram of an exemplary partitioned equalizer system, in accordance with an embodiment of the invention. Referring to FIG. 1, there is shown a partitioned equalizer 100. In an exemplary embodiment of the invention, the partitioned equalizer 100 may comprise 2 partitions. The partitioned equalizer 100 may comprise a time shift block 102, FFT blocks 104, 114, and 126, a first partition adaptive filter block 106, a second partition adaptive filter block 116, IFFT filter blocks 108 and 118, zero-fill block 124 and take-second blocks 110 and 120, and summation blocks 112 and 122.

In an exemplary embodiment of the invention the time shift block 102 may comprise suitable logic, circuitry and/or code that are operable to receive a time domain signal, x(n), and generate a time shifted signal x(n–L), where n represents a sample time index and L represents the time shift inserted by the time shift block 102. In an exemplary embodiment of the invention, L=128 samples.

The FFT block 104 may comprise suitable logic, circuitry and/or code that are operable to receive a time domain signal x(n) and generate a frequency domain representation X(k), where k represents a block time index. In an exemplary embodiment of the invention, the frequency domain representation may be generated by utilizing a 256-point FFT algorithm. The FFT blocks 114 and 126 are substantially similar to FFT block 104.

The IFFT block 108 may comprise suitable logic, circuitry and/or code that are operable to receive a frequency domain signal and generate a time domain representation of the signal. In an exemplary embodiment of the invention, the time domain signal may be generated by utilizing a 256-point IFFT algorithm. The IFFT block 118 is substantially similar to IFFT block 108.

The take-2nd block 110 may comprise suitable logic, circuitry and/or code that are operable to receive a time domain input signal and generate a time-windowed version of the input signal. The time-windowed version of the input signal may choose the second block of IFFT output samples. In an exemplary embodiment of the invention, the take-2nd block 110 may be represented by a 128×128 block zero matrix (0) and a 128×128 identity matrix (I). Each of the entries in the block zero matrix may be equal to 0. The take-2nd block 110 may generate a vector representation of the time domain input signal, which comprises 128 samples. The take-2nd block 110 may generate a time-windowed output signal, y(n), which comprises the second 128 block samples from the output of IFFT block 108 time domain 256 samples. The take-2nd block 120 is substantially similar to take-2nd block 110.

The summation block 112 may comprise suitable logic, circuitry and/or code that are operable to receive input signals and generate an output signal that represents the sum of values of the input signals. The summation block 112 may generate a time domain output signal, which comprises a plurality of samples. The value of each of the generated plurality of samples in the output signal may be generated by computing a sum among corresponding samples from each of the input signals. Summation block 122 is substantially similar to summation block 112.

The first partition adaptive filter block 106 may comprise suitable logic, circuitry and/or code that are operable to receive a frequency domain input signal X(k) and a frequency domain error signal E(k), and generate an adaptive filter output signal Y(k) by performing unconstrained adaptive filtering in the frequency domain, in accordance with an embodiment of the invention. The first partition adaptive filter block 106 is shown in more detail in FIG. 2. The second partition adaptive filter block 116 is substantially similar to the first partition adaptive filter block 106.

In operation, the partitioned equalizer 100 may receive a time domain input signal x(n). The time domain input signal x(n) may comprise 256 samples. The FFT block 104 may perform a 256-point FFT algorithm to generate a frequency domain representation of the time domain input signal, $X_1(k)$. The first partition adaptive filter 106 may receive the frequency domain input signal $X_1(k)$ and a frequency domain representation of an error signal E(k) and generate a filtered frequency domain output signal $Y_1(k)$. The first partition adaptive filter 106 may generate the output signal $Y_1(k)$ by utilizing an unconstrained adaptive filtering algorithm in the frequency domain, in accordance with an embodiment of the invention. The IFFT block 108 may receive the frequency domain signal $Y_1(k)$ and generate a time domain representation of $Y_1(k)$. The take-2nd block 110 may receive the time domain representation of $Y_1(k)$ and generate a time-windowed output signal $y_1(n)$.

The time shift block 102 may generate a time delayed version of the input signal x(n), which is identified in FIG. 1 as the signal x(n–L). In an exemplary embodiment of the invention, L=128, which represents a 128 sample time shift. The FFT block 114 may perform a 256-point FFT algorithm on the signal x(n–L) to generate a frequency domain signal, $X_2(k)$. The second partition adaptive filter 116 may receive the frequency domain input signal $X_2(k)$ and the error signal E(k) and generate a filtered frequency domain output signal $Y_2(k)$. The second partition adaptive filter 116 may generate the output signal $Y_2(k)$ by utilizing an unconstrained adaptive filtering algorithm in the frequency domain, in accordance with an embodiment of the invention. The IFFT block 118 may receive the frequency domain signal $Y_2(k)$ and generate a time domain representation of $Y_2(k)$. The take-2nd block 120 may receive the time domain representation of $Y_2(k)$ and generate a time-windowed output signal $y_2(n)$.

The summation block 112 may receive the time domain signals $y_1(n)$ and $y_2(n)$ and generate an output signal y(n). The summation block 122 may receive the output signal y(n) and the desired response signal d(n) and generate an error signal c(n). The zero-fill block 124 may generate a time-extended version of the error signal c(n). The FFT block 126 may receive the time-extended error signal from the zero-fill block 124 and generate a frequency domain representation E(k). The frequency domain error signal E(k) may be input to the first partition adaptive filter 106 and the second partition adaptive filter 116.

Figure 2:
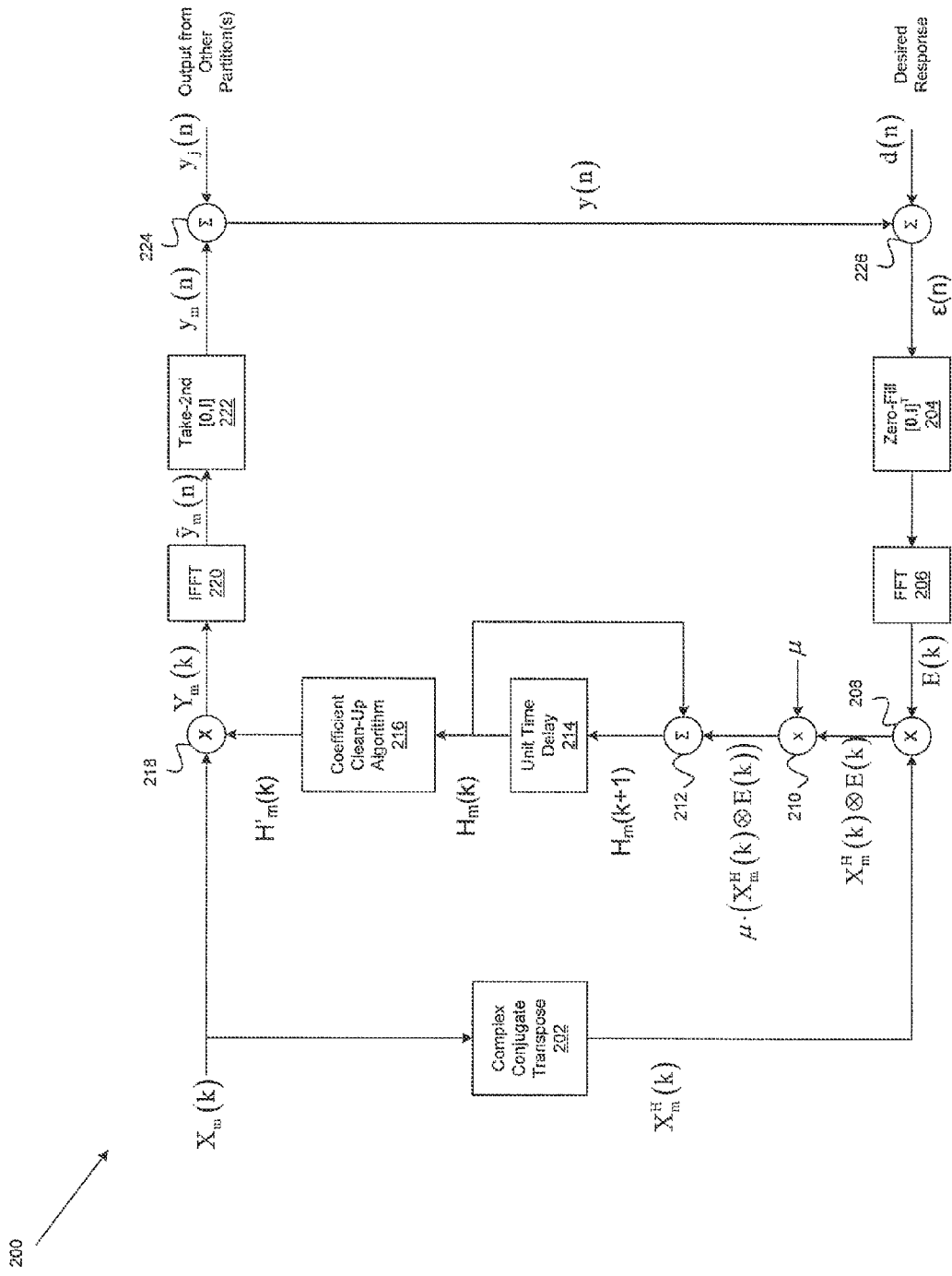
FIG. 2 is a block diagram of an exemplary adaptive filter for unconstrained frequency domain adaptive filtering, in accordance with an embodiment of the invention.

FIG. 2 is a block diagram of an exemplary adaptive filter for unconstrained frequency domain adaptive filtering, in accordance with an embodiment of the invention. Referring to FIG. 2, there is shown an adaptive filter 200. The adaptive filter 200 may comprise an exemplary embodiment of the first partition adaptive filter 106 and the second partition adaptive filter 116. The adaptive filter 200 may comprise a complex conjugate transpose block 202, zero-fill blocks 204, a take-$2^{nd}$ block 222, a FFT block 206, an IFFT block 220, a unit time delay block 214, a coefficient clean-up block 216, summation blocks 212, 224 and 226, convolution blocks 208 and 218 and element-wise multiplication block 210. In various embodiments of the invention, the adaptive filter 200 may comprise an $m^{th}$ partition among a plurality of partitions in a partitioned frequency domain adaptive filter. The summation blocks 212, 224 and 226 are substantially similar to the summation block 112. In an exemplary embodiment of the invention, the partitioned frequency domain adaptive filter may comprise 2 partitions, as shown in FIG. 1.

The complex conjugate transpose block 202 may comprise suitable logic, circuitry and/or code that are operable to receive a frequency domain input signal, $X_m(k)$, and generate a complex conjugate (or Hermitian) transpose version of the input signal, $X_m^H(k)$.

The convolution block 208 may comprise suitable logic, circuitry and/or code that are operable to receive input signals and perform a convolution operation on those input signals. In an exemplary embodiment of the invention, the convolution block 208 may perform a circular convolution.

The element-wise multiplication block 210 may comprise suitable logic, circuitry and/or code that are operable to receive a step size input vector µ and a gradient input vector. The element-wise multiplication block 210 may multiply each entry in the input gradient vector and each entry in the input step size vector µ.

The unit time delay block 214 may comprise suitable logic, circuitry and/or code that are operable to receive an input signal at a given time instant and generate a delayed output of the received input signal at a subsequent time instant. In an exemplary embodiment of the invention, the unit time delay block 214 may be operable to generate a delayed output of the received input signal, which comprises one block time unit delay.

The coefficient clean-up block 216 may comprise suitable logic, circuitry and/or code that are operable to receive an input coefficient vector. The coefficient clean-up block 216 may modify one or more coefficient values in the input coefficient vector to enable unconstrained frequency domain adaptive filtering.

In a partitioned adaptive filter, samples from the output from an $m^{th}$ partition may be time-coincident with samples from the output of a $j^{th}$ partition. Some conventional adaptive filtering designs utilize a gradient constraint to adjust the outputs from the different partitions to compensate for overlap. In various embodiments of the invention, the coefficient clean-up block 216 may enable an $m^{th}$ partition in an adaptive filter to compensate for overlap without utilizing a constraint, such as a gradient constraint.

In operation, the adaptive filter 200 may be operable to receive a frequency domain input $X_m(k)$, which is represented as a vector. The complex conjugate transpose block 202 may receive the input vector $X_m(k)$ and generate a complex conjugate transpose output vector $X_m^H(k)$. The summation block 226 may receive a time domain input signal, d(n), which is represented as a vector. The summation block 226 may also receive a time domain output signal, y(n), which is generated by the adaptive filter 200. The output signal y(n) is represented as a time series. The summation block 226 may generate an error signal, $\epsilon(n)$, based on the input signals d(n) and y(n), as shown in the following equation:

$$\epsilon(n)=y(n)-d(n) \quad [1]$$

where $\epsilon(n)$ is a time domain signal, which is represented as a time series, and n is a time index value. Values for n may be integers, which may be indicative that the time domain signals $\epsilon(n)$, y(n) and d(n) comprise a sequence of samples. $\epsilon(n)$ will be buffered by zero-fill block 204 to generate a vector for block processing.

The zero-fill block 204 may generate a suitable time-extended version of the error signal $\epsilon(n)$ based on the number of samples in $\epsilon(n)$ and the number of points in the FFT block 206. The FFT block 206 may receive the output from the zero-fill block 204 and generate a frequency domain error signal E(k), where k is a block time index value. The convolution block 208 may receive the frequency domain inputs E(k) and $X_m^H(k)$ and generate a convolution result, $X_m^H(k) \otimes E(k)$, which is represented as a vector and will be referred to as gradient vector later. The element-wise multiplication block 210 may receive the convolution result and a vector step size value, µ(k). The vector step size value may determine how quickly the adaptive filter coefficient values, H(k), may change in value across a range of time instants. The element-wise multiplication block 210 may multiply each entry in the convolution result gradient vector, $X_m^H(k) \otimes E(k)$, by the vector step size value µ(k) to generate an update vector $\mu \cdot (X_m^H(k) \otimes E(k))$. The summation block 212 may receive the update vector, $\mu \cdot (X_m^H(k) \otimes E(k))$, a coefficient vector at a current block time instant, $H_m(k)$, and generate an updated coefficient vector, $H_m(k+1)$, as shown in the following equation:

$$H_m(k+1)=H_m(k)+\mu \cdot (X_m^H(k) \otimes E(k)) \quad [2]$$

The unit time delay block 214 may receive the updated coefficient vector $H_m(k+1)$ at a current block time instant, and output the updated coefficient vector as the new current coefficient vector $H_m(k)$ at a subsequent block time instant.

The coefficient clean-up block 216 may receive the current coefficient vector $H_m(k)$ and generate an overlap adjusted coefficient vector $H'_m(k)$. The convolution module 218 may receive the frequency domain input vector $X_m^H(k)$ and the overlap adjusted coefficient vector $H'_m(k)$ and generate a frequency domain convolution result, $Y_m(k)$ as shown in the following equation:

$$Y_m(k)=X_m(k) \otimes H'_m(k) \quad [3]$$

The IFFT block 220 may receive the frequency domain $Y_m(k)$ and generate a time domain signal, $\tilde{y}_m(n)$. The take-2nd block 222 may generate a suitable time-windowed version, which is the output from the $m^{th}$ partition in the adaptive filter, $y_m(n)$. The summation block 224 may add the output $y_m(n)$ with one or more outputs from other partitions $y_j(n)$ to generate a new output y(n). The new output y(n) may be input to the summation block 226 to enable generation of a new error vector $\epsilon(n)$, and subsequent adaptive modification of the coefficient vector $H_m(k)$.

Figure 3:
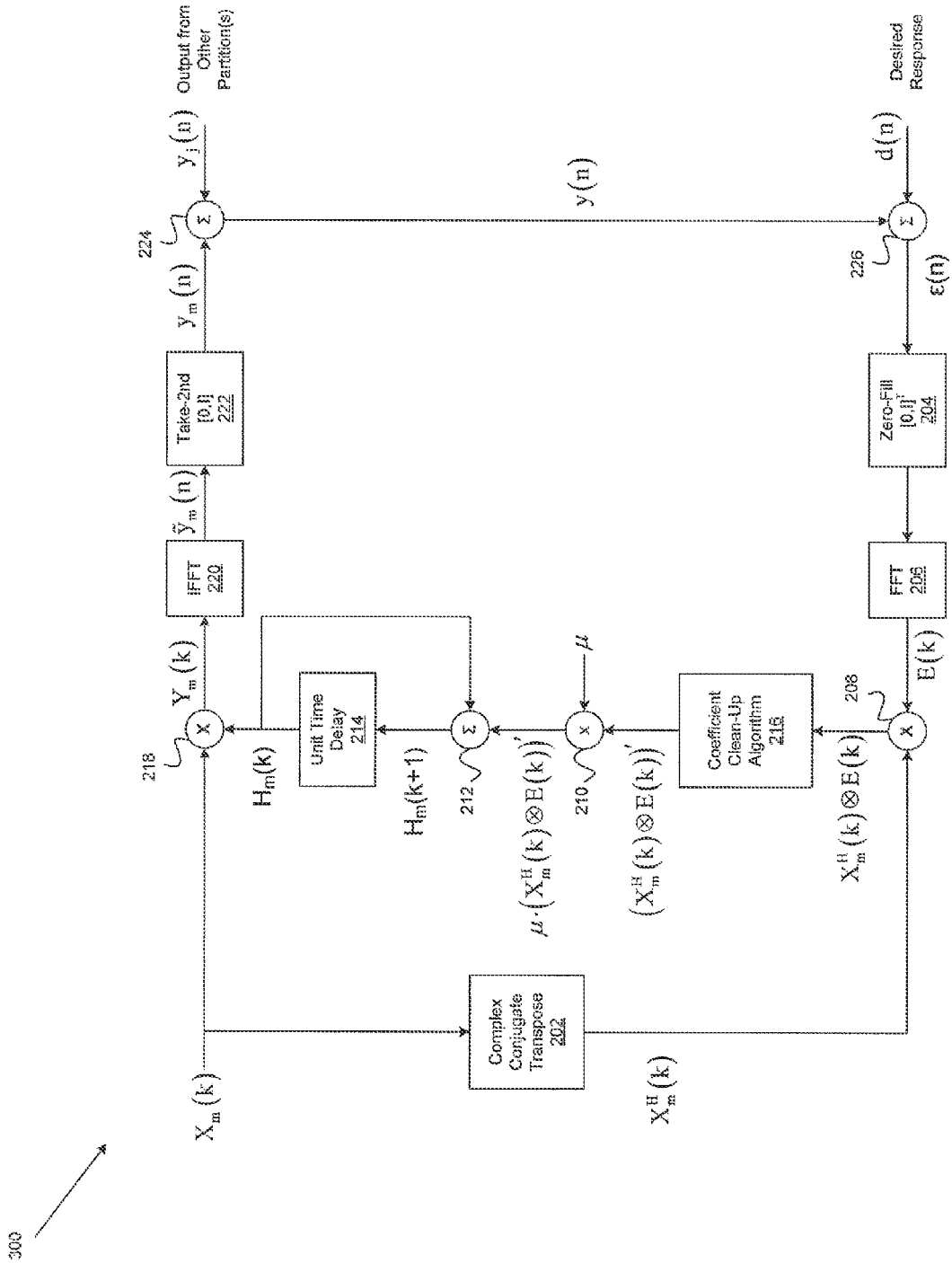
FIG. 3 is a block diagram of an exemplary adaptive filter for unconstrained frequency domain adaptive filtering, in accordance with an embodiment of the invention.

FIG. 3 is a block diagram of an exemplary adaptive filter for unconstrained frequency domain adaptive filtering, in accordance with an embodiment of the invention. Referring to FIG.

3, there is shown an adaptive filter 300. The adaptive filter 300 differs from the adaptive filter 200 in the aspect that in the adaptive filter 300, the coefficient clean-up block 216 performs the overlap compensation on the output of the convolution block 208. Thus, the coefficient clean-up block 216 receives the convolution result, $X_m^H(k) \otimes E(k)$, and generates an overlap compensated version convolution result, $(X_m^H(k) \otimes E(k))'$.

Figure 4:
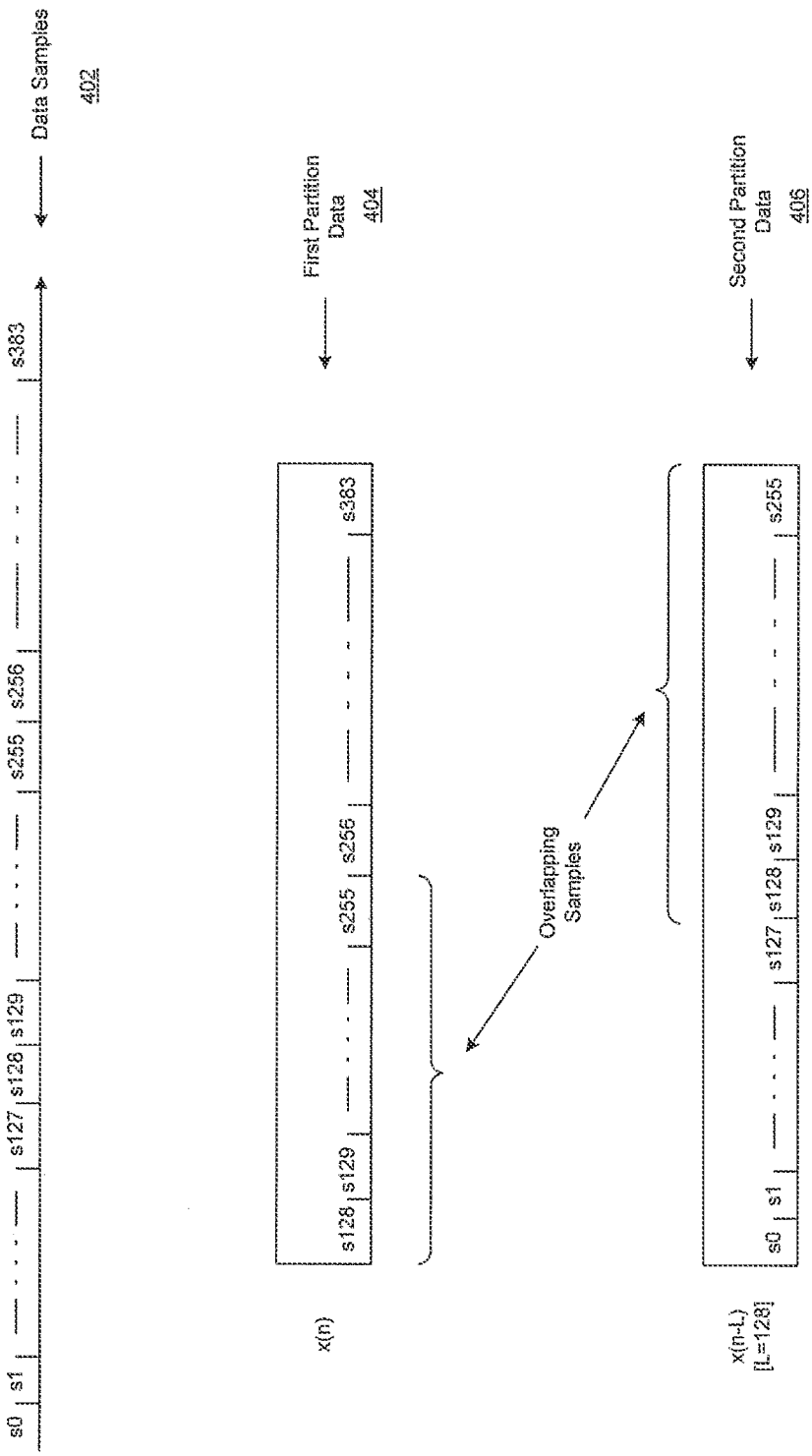
FIG. 4 is a diagram that illustrates exemplary partitioning of input data samples, which may be utilized in connection with an embodiment of the invention.

The overlap of samples between partitions and the effect on adaptive filtering may be further illustrated with reference to FIG. 4. Referring to FIG. 4, there is shown a plurality of data samples 402 from a data source. An exemplary data source is a processor within a communication device. The data samples are identified as a sequence s0, s1, . . . , s127, s128, s129, . . . , s255, s256, . . . and s383. Also shown in FIG. 4 is an input signal, x(n), 404 for which n is an index whose value ranges from 0 to 255 and a time shifted version, x(n−L), 406 where L=128. The signal x(n) 404 may comprise the most recent 256 samples from the data source 402. Thus, x(n) 404 comprises data samples s128, s129, . . . , s255, s256, . . . and s383. The time shifted version signal x(n−L) 406 comprises data samples s0, s1, . . . , s127, s128, s129, . . . , s255. The overlapping data samples, which are present in both x(n) 404 and x(n−L) 406, are data samples s128, s129, . . . and s255.

In various embodiments of the invention, compensation for overlap between adaptive filter partitions may comprise removal of overlapping samples from a current partition. The samples removed from the current partition may be utilized in a subsequent partition. As samples are moved from the current partition, for example an $m^{th}$ partition, to the subsequent partition, for example a $j^{th}$ partition, the values of corresponding coefficient vectors, $H_m(k)$ and $H_j(k)$, may be adjusted. In various embodiments of the invention, the coefficient clean-up block 216 may compute the adjusted coefficient vectors in the frequency domain for the current and subsequent partitions, respectively. In an exemplary embodiment of the invention, each partition may comprise a separate coefficient clean-up block 216, such that the respective coefficient clean-up block 216 work cooperatively to compute the adjusted coefficient vectors for the current and subsequent partitions. In another exemplary embodiment of the invention, a separate coefficient clean-up block 216 may compute the adjusted coefficient vectors for the current and subsequent partitions. In various embodiments of the invention, the coefficient clean-up block 216 may be implemented in a processor, memory and/or other suitable computational and/or processing circuitry.

In an exemplary embodiment of the invention, time domain impulse response, which corresponds to the overlapping sample s128 may be the focus of overlap compensation while the time domain impulse response, which corresponds to the remaining overlapping samples s129, . . . and s255 may be ignored. In this instance, given frequency domain impulse response vectors for the first and second partitions $H_0(k)$ and $H_1(k)$, which may be represented as follows:

$$H_0(k)=[H_0^0\ H_0^1\ \ldots\ H_0^{255}] \quad [4a]$$

$$H_1(k)=[H_1^0\ H_1^1\ \ldots\ H_1^{255}] \quad [4b]$$

adjusted coefficient vectors may be computed by representing the corresponding time domain impulse response vectors as follows:

$$h_0(n)=[0\ \ldots\ k_{128}\ 0\ \ldots\ 0] \quad [5a]$$

$$h_1(n)=[h_0\ 0\ \ldots\ 0\ \ldots\ 0] \quad [5b]$$

where $h_0(n)$ and $h_1(n)$ represent the time domain impulse response vectors for the first and second partitions in a partitioned adaptive filter, respectively; $H_m^n$ represents the $n^{th}$ frequency domain coefficient in the $m^{th}$ partition; and $h_{128}$ represents a $129^{th}$ coefficient value in coefficient vector $h_0(n)$ while $h_0$ represents a $1^{st}$ coefficient value in coefficient vector $h_1(n)$.

In an exemplary embodiment of the invention in which an overlapping sample is removed from the $1^{st}$ partition, the clean-up block 216 may compute a value for coefficient $h_{128}$ based on vector $H_0(k)$. Adjusted coefficient vectors $H'_0(k)$ and $H'_1(k)$ may be computed based on the computed coefficient value $h_{128}$. In another exemplary embodiment of the invention in which an overlapping sample is removed from the $2^{nd}$ partition, the clean-up block 216 may compute a value for coefficient $h_0$ based on vector $H_1(k)$. Adjusted coefficient vectors $H'_0(k)$ and $H'_1(k)$ may be computed based on the computed coefficient value $h_0$.

In an exemplary embodiment of the invention, $h_{128}$ may be computed as shown below:

$$h_{128} = \frac{H_0^0 - H_0^1 + H_0^2 - H_0^3 + \ldots - H_0^{255}}{256} \quad [6a]$$

$h_0$ may be computed as shown below:

$$h_0 = \frac{H_0^0 - H_0^1 + H_0^2 - H_0^3 + \ldots - H_0^{255}}{256} \quad [6b]$$

The computations shown in equations [6] may be generalized as shown in the following equations:

$$h_m^{C/2} = \frac{H_m^0 + H_m^{C/2} + 2 \times \sum_{i=1}^{\frac{C}{2}-1} (-1)^i \times H_m^i}{C} \quad [7a]$$

$$h_{m+1}^0 = \frac{H_{m+1}^0 + H_{m+1}^{C/2} + 2 \times \sum_{i=1}^{\frac{C}{2}-1} H_{m+1}^i}{C} \quad [7b]$$

where $h_j^i$ represents the $i^{th}$ time domain coefficient in the $j^{th}$ partition and C corresponds to the number of points in an FFT algorithm.

Based on the computed value $h_{128}$ corresponding frequency domain correction vectors for the first and second partitions may be computed as follows:

$$\tilde{H}_0(k)=h_{128} \cdot [1\ -1\ 1\ -1\ \ldots\ 1\ -1] \quad [8a]$$

$$\tilde{H}_1(k)=h_{128} \cdot [1\ 1\ 1\ 1\ \ldots\ 1\ 1] \quad [8b]$$

In an exemplary embodiment of the invention in which an overlapping sample is removed from the $1^{st}$ partition and add adjustment to $2^{nd}$ partition, the clean-up block 216 may compute adjusted coefficient vectors $H'_0(k)$ and $H'_1(k)$ as follows:

$$H'_0(k)=H_0(k)-\tilde{H}_0(k) \quad [9a]$$

$$H'_1(k)=H_1(k)+\tilde{H}_1(k) \quad [9b]$$

Various embodiments of the invention are not limited to a 2 partition adaptive filter. The procedure described above may be practiced in adaptive filters that comprise a variety of partitions by computing adjusted coefficient vectors between an $m^{th}$ partition and an $(m+1)^{th}$ partition. For example, in an adaptive filter, which comprises 4 partitions, adjusted coefficient vectors may be computed between partition 0 and partition 1, partition 1 and partition 2, and partition 2 and partition 3, respectively.

In various embodiments of the invention, the coefficient clean-up block may perform operations on a plurality of partitions wherein the first partition is not adjusted whereas the remaining partitions may be adjusted as described below:

For every partition 'i' except the first, do the following:

$$h_0 = (H_i^0 + H_i^1 + \ldots + H_i^{255})/256 \quad [10a]$$

$$\tilde{H}_i(k) = h_0 \cdot [1\ 1\ \ldots\ 1] \quad [10b]$$

$$H'_i(k) = H_i(k) - \tilde{H}_i(k) \quad [10c]$$

In various other embodiments of the invention, the coefficient clean-up block may perform operations on a plurality of partitions wherein the last partition is not adjusted whereas the remaining partitions may be adjusted as described below:

For every partition 'i' except the last, do the following:

$$h_{128} = (H_i^0 - H_i^1 + \ldots - H_i^{255})/256 \quad [11a]$$

$$\tilde{H}_i(k) = h_{128} \cdot [1\ -1\ 1\ -\ \ldots\ -1] \quad [11b]$$

$$H'_i(k) = H_i(k) - \tilde{H}_i(k) \quad [11c]$$

Figure 5:
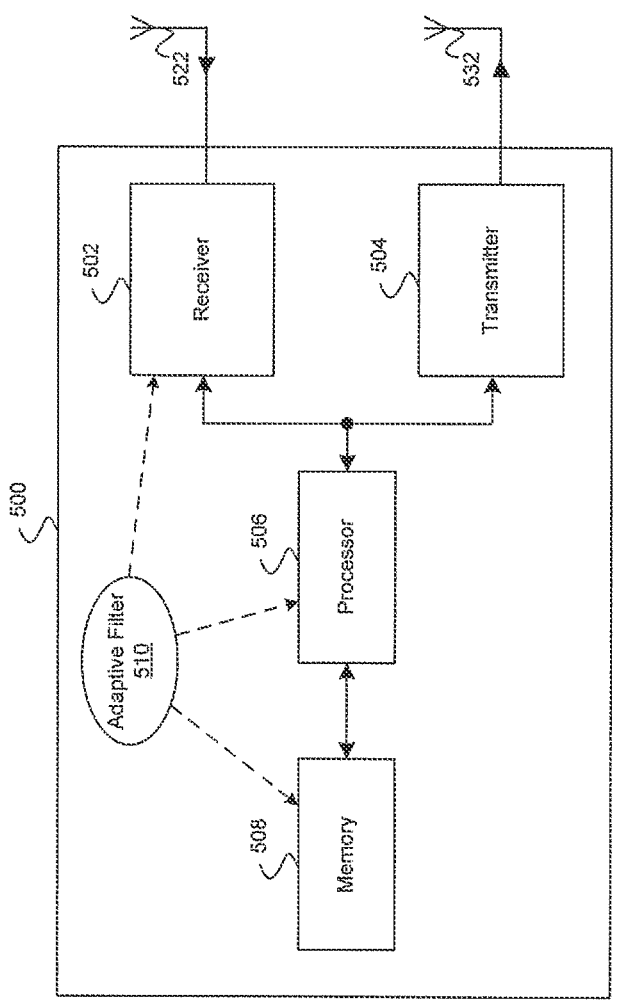
FIG. 5 is a diagram of an exemplary communication device, which may utilize unconstrained frequency domain adaptive filtering, in accordance with an embodiment of the invention.

FIG. 5 is a diagram of an exemplary communication device, which may utilize unconstrained frequency domain adaptive filtering, in accordance with an embodiment of the invention. Referring to FIG. 5, there is shown a transceiver system 500, a receiving antenna 522 and a transmitting antenna 532. The transceiver system 500 may comprise at least a receiver 502, a transmitter 504, a processor 506, an adaptive filter 510 and a memory 508. Although a separate receiver 502 and transmitter 504 is shown in FIG. 5, the invention is not limited. In this regard, the transmit function and receive function may be integrated into a single transceiver. The transceiver system 500 may also comprise a plurality of transmitting antennas and/or a plurality of receiving antennas. Various embodiments of the invention may comprise a single antenna, which is coupled to the transmitter 504 and receiver 502 via a transmit and receive (T/R) switch.

The receiver 502 may comprise suitable logic, circuitry, interfaces and/or code that may be operable to perform receive functions that may comprise PHY layer function for the reception or signals. These PHY layer functions may comprise, but are not limited to, the amplification of received RF signals, generation of frequency carrier signals corresponding to selected RF channels, for example uplink or downlink channels, the down-conversion of the amplified RF signals by the generated frequency carrier signals, demodulation of data contained in data symbols based on application of a selected demodulation type, and detection of data contained in the demodulated signals. The RF signals may be received via the receiving antenna 522. The data may be communicated to the processor 506.

The transmitter 504 may comprise suitable logic, circuitry, interfaces and/or code that may be operable to perform transmit functions that may comprise PHY layer function for the transmission or signals. These PHY layer functions may comprise, but are not limited to, modulation of received data to generate data symbols based on application of a selected modulation type, generation of frequency carrier signals corresponding to selected RF channels, for example uplink or downlink channels, the up-conversion of the data symbols by the generated frequency carrier signals, and the generation and amplification of RF signals. The data may be received from the processor 506. The RF signals may be transmitted via the transmitting antenna 532.

The processor 506 may comprise suitable logic circuitry, interfaces and/or code that may be operable to control operation of the receiver 502 and/or the transmitter 504.

The memory 508 may comprise suitable logic, circuitry, interfaces and/or code that may enable storage and/or retrieval of data and/or code. The memory 508 may utilize any of a plurality of storage medium technologies, such as volatile memory, for example random access memory (RAM), and/or non-volatile memory, for example electrically erasable programmable read only memory (EEPROM). In the context of the present application, the memory 508 may enable storage of coefficients, for example.

The adaptive filter 510 may comprise suitable logic, circuitry and/or code that may be operable to provide, for example, acoustic echo cancellation in the communication device. The adaptive filter 510 may comprise a partitioned adaptive filter for unconstrained frequency domain adaptive filtering, in accordance with an embodiment of the invention. The adaptive filter 510 may comprise a plurality of adaptive filter partitions 200. The processor 506 may comprise at least a portion of the adaptive filter 510, the memory 508 may comprise at least a portion of the information that may be utilized to implement the adaptive filter 510 and/or the receiver 502 may comprise at least a portion of the adaptive filter 510.

In operation, the processor 506 may be operable to compute coefficients in a partitioned adaptive filter for unconstrained frequency domain adaptive filtering. The processor 506 may utilize data and/or code that are stored in the memory 508. In an exemplary embodiment of the invention, the memory 508 may comprise a computer readable medium, having stored thereon, a computer program having at least one code section executable by the processor 506 and/or a computer, thereby causing the processor 506 and/or computer to perform the steps as described herein for unconstrained frequency domain adaptive filtering. The processor 506 may execute a computer program and/or utilize data stored in the memory 508 while performing steps as described herein for unconstrained frequency domain adaptive filtering. While performing the steps as described herein for unconstrained frequency domain adaptive filtering, the processor 506 may configure the receiver 502 for unconstrained frequency domain adaptive filtering. For example, the processor 506 may compute coefficient vectors and configure the receiver 502 based on the coefficient vectors. In an exemplary embodiment of the invention, the computed coefficient vectors may comprise a plurality of frequency domain coefficients.

In an exemplary embodiment of the invention, one or more circuits comprising a receiver 502, a transmitter 504, a processor 506, memory 508 and/or adaptive filter 510 may be operable to select one or more time domain coefficients in a filter partition. The selected time domain coefficients may be selected based on a number of tap in an FFT 104. At least a portion of the one or more circuits may be operable to compute a value for each of the selected one or more time domain coefficients in a current filter partition 200. A value may be computed for each of the selected time domain coefficient(s) based on a corresponding plurality of frequency domain coefficients. Based on the computed time domain coefficient value(s), the corresponding plurality of frequency domain coefficient values may be adjusted. A subsequent plurality of frequency domain coefficients in a subsequent filter partition 200 may be adjusted based on the computed time domain value(s).

A processor 506 may be operable to compute the selected one or more time domain coefficients as shown in equations [6]. The processor 506 may compute a frequency domain correction vector as shown in equations [8]. The processor 506 may compute the adjusted corresponding plurality of frequency domain coefficients and the adjusted subsequent plurality of frequency domain coefficients as shown in equations [9].

The one or more circuits may be operable to process input signals in the current filter partition based on the adjusted corresponding plurality of frequency domain coefficients and to process a time-adjusted version of the input signals in the subsequent filter partition based on the adjusted subsequent plurality of frequency domain coefficients.

An FFT 104 may be utilized to generate a frequency domain version of the input signals. A convolution module 218 may generate an output signal from the current partition 200 by convolving the adjusted corresponding plurality of frequency domain coefficients and the frequency domain version of the input signals.

Figure 6:
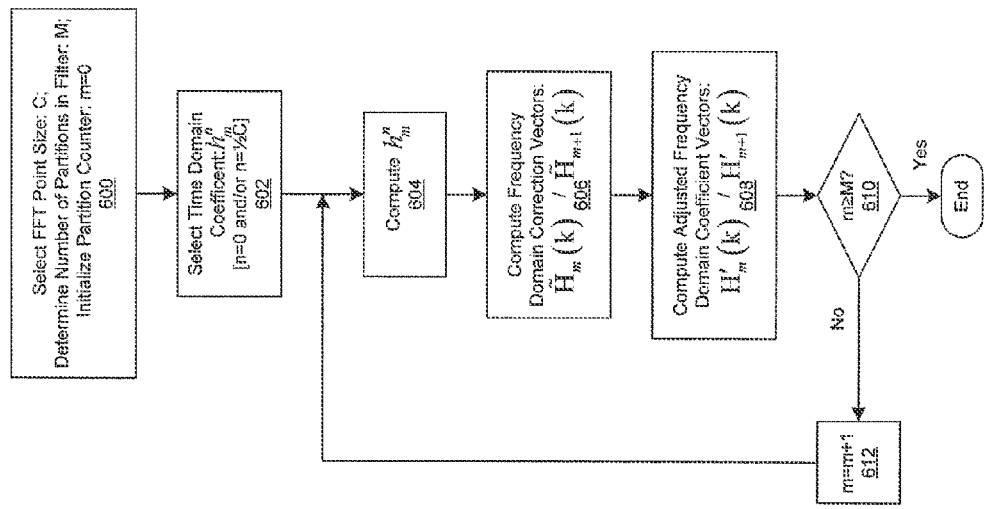
FIG. 6 is a flowchart that illustrates exemplary steps for unconstrained frequency domain adaptive filtering, in accordance with an embodiment of the invention.

FIG. 6 is a flowchart that illustrates exemplary steps for unconstrained frequency domain adaptive filtering, in accordance with an embodiment of the invention. Referring to FIG. 6, in step 600, a processor 506 may select an FFT point size (C), determine the number of partitions in the filter (M), and initialize the partition counter (m=0). In step 602, the processor 506 may select an $n^{th}$ time domain coefficient in an $m^{th}$ partition in an adaptive filter 200, $h_m^n$. In an exemplary embodiment of the invention, which utilizes a C-point FFT algorithm, n=0 and/or n=½C. In step 604, the processor 506 may compute a value for $h_m^n$. The value for $h_m^n$ may be computed based on current values in a corresponding frequency domain coefficient vector $H_m(k)$. In step 606, a frequency domain correction vectors, $\hat{H}_m(k)$ and $\hat{H}_{m+1}(k)$, may be computed based on the computed value $h_m^n$. In step 608, adjusted coefficient vectors, $H'_m(k)$ and $H'_{m+1}(k)$, may be computed based on the corresponding frequency domain coefficient vectors and the corresponding computed correction vectors. The adjusted coefficient vectors may be utilized for unconstrained frequency domain adaptive filtering, in accordance with an embodiment of the invention. Step 610 may determine whether there are additional remaining partitions. In instances in which there are remaining partitions, in step 612, the partition counter value may be incremented. Step 604 may follow step 612.

Another embodiment of the invention may provide a machine and/or computer readable medium, having stored thereon, a computer program having at least one code section executable by a machine and/or computer, thereby causing the machine and/or computer to perform the steps as described herein for unconstrained frequency domain adaptive filtering.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A communication device, comprising:
a receiver configured to receive a radio frequency (RF) signal; and
an adaptive filter configured to filter a portion of the RF signal based upon a plurality of frequency domain coefficients, where at least a portion of the plurality of frequency domain coefficients is adjusted based upon a computed value for a time domain coefficient in a filter partition based upon the plurality of frequency domain coefficients, where the time domain coefficient in the filter partition overlaps with a corresponding time domain coefficient in a time delayed filter partition, and where computing the computed value comprises adding a value for a first frequency domain coefficient of the plurality of frequency domain coefficients and a value for each even-numbered frequency domain coefficient of the plurality of frequency domain coefficients.

2. The communication device of claim 1, wherein computing the computed value comprises subtracting a value for each odd-numbered frequency domain coefficient of the plurality of frequency domain coefficients.

3. The communication device of claim 2, wherein the adaptive filter adjusts the plurality of frequency domain coefficients based upon a frequency domain correction vector computed by multiplying the computed value with a vector, wherein odd-numbered coefficients of the vector are equal to 1 and even-numbered coefficients are equal to −1.

4. The communication device of claim 1, wherein computing the computed value comprises adding a value for each odd-numbered frequency domain coefficient of the plurality of frequency domain coefficients.

5. The communication device of claim 4, wherein the adaptive filter adjusts the plurality of frequency domain coefficients based upon a frequency domain correction vector computed by multiplying the computed value with a vector, wherein coefficients of the vector are equal to 1.

6. The communication device of claim 1, wherein the adaptive filter is further configured to filter a time adjusted portion of the RF signal based upon a second plurality of frequency domain coefficients, where at least a portion of the second plurality of frequency domain coefficients is adjusted based upon a second computed value for a time domain coefficient in a corresponding filter partition based upon the second plurality of frequency domain coefficients.

7. The communication device of claim 1, wherein the adaptive filter generates a filtered output signal by convolving the plurality of frequency domain coefficients with a frequency domain version of the portion of the RF signal.

8. The communication device of claim 7, comprising processing circuitry configured to generate the frequency domain version of the portion of the RF signal.

9. The communication device of claim 1, comprising processing circuitry configured to compute the value.

10. The communication device of claim 1, comprising a transceiver including the receiver and a transmitter.

11. An adaptive filter, comprising:
processing circuitry configured to filter a portion of an input signal based upon a plurality of frequency domain coefficients; and
processing circuitry configured to adjust the plurality of frequency domain coefficients based upon a computed value for a time domain coefficient in a filter partition based upon the plurality of frequency domain coefficients, where the time domain coefficient of the filter partition overlaps with a corresponding time domain coefficient of a time delayed filter partition, and where computing the computed value comprises adding a value for a first frequency domain coefficient of the plurality of frequency domain coefficients and a value for each even-numbered frequency domain coefficient of the plurality of frequency domain coefficients.

12. The adaptive filter of claim 11, wherein computing the computed value comprises subtracting a value for each odd-numbered frequency domain coefficient of the plurality of frequency domain coefficients.

13. The adaptive filter of claim 11, wherein computing the computed value comprises adding a value for each odd-numbered frequency domain coefficient of the plurality of frequency domain coefficients.

14. The adaptive filter of claim 11, wherein the processing circuitry configured to adjust the plurality of frequency domain coefficients:
determines a frequency domain correction vector based upon the computed value; and
adjusts the plurality of frequency domain coefficients based upon the frequency domain correction vector.

15. The adaptive filter of claim 11, further comprising processing circuitry configured to filter a time adjusted portion of the input signal based upon a second plurality of frequency domain coefficients.

16. The adaptive filter of claim 15, further comprising processing circuitry configured to adjust the second plurality of frequency domain coefficients based upon a second computed value for a time domain coefficient in a corresponding filter partition based upon the second plurality of frequency domain coefficients.

17. The adaptive filter of claim 11, wherein the processing circuitry configured to filter the portion of the input signal generates a filtered output signal by convolving the plurality of frequency domain coefficients with a frequency domain version of the portion of the input signal.

18. A non-transitory computer readable medium having a program stored thereon that, when executed by processing circuitry including a processor, causes the processing circuitry to:
generate a filtered output signal from an input signal based upon a plurality of frequency domain coefficients; and
adjust the plurality of frequency domain coefficients based upon a computed value for a time domain coefficient in a filter partition based upon the plurality of frequency domain coefficients, where the time domain coefficient of the filter partition overlaps with a corresponding time domain coefficient of a time delayed filter partition, and where computing the computed value comprises adding a value for a first frequency domain coefficient of the plurality of frequency domain coefficients and a value for each even-numbered frequency domain coefficient of the plurality of frequency domain coefficients.

19. The non-transitory computer readable medium of claim 18, wherein computing the computed value comprises subtracting a value for each odd-numbered frequency domain coefficient of the plurality of frequency domain coefficients.

20. The non-transitory computer readable medium of claim 18, wherein the program further causes the processing circuitry to generate a second filtered output signal from a time shifted version of the input signal based upon a second plurality of frequency domain coefficients.

* * * * *